United States Patent
Kramer et al.

(10) Patent No.: US 6,207,904 B1
(45) Date of Patent: Mar. 27, 2001

(54) PRINTED WIRING BOARD STRUCTURE HAVING CONTINUOUS GRAPHITE FIBERS

(75) Inventors: Jesse J. Kramer, Park Ridge; Jeffrey R. Madura, Lake Zurich; Carl Richard Smith, Cary, all of IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/324,255

(22) Filed: Jun. 2, 1999

(51) Int. Cl.[7] .................................................. H05K 1/03
(52) U.S. Cl. .................. 174/255; 174/262; 174/258; 428/113; 428/114
(58) Field of Search .................. 174/255, 256, 174/258, 262; 428/175, 171, 113, 114

(56) References Cited

U.S. PATENT DOCUMENTS

| | | | |
|---|---|---|---|
| 3,936,535 | 2/1976 | Boder | 427/228 |
| 4,318,954 | * 3/1982 | Jensen | 174/258 |
| 4,609,586 | 9/1986 | Jensen et al. | 428/209 |
| 4,654,248 | 3/1987 | Mohammed | 428/137 |
| 4,791,248 | 12/1988 | Oldenettel | 174/68.5 |
| 4,867,235 | 9/1989 | Grapes et al. | 165/185 |
| 4,882,454 | 11/1989 | Peterson et al. | 174/68.5 |
| 4,963,697 | 10/1990 | Peterson et al. | 174/252 |
| 4,970,553 | * 11/1990 | Orlowski et al. | 355/200 |
| 5,002,823 | 3/1991 | Chen | 428/288 |
| 5,103,293 | * 4/1992 | Bonafino et al. | 357/80 |
| 5,296,310 | 3/1994 | Kibler et al. | 428/614 |
| 5,309,629 | 5/1994 | Traskos et al. | 29/830 |
| 5,571,608 | 11/1996 | Swamy | 428/246 |
| 5,633,072 | 5/1997 | Middelman et al. | 428/209 |
| 5,699,613 | 12/1997 | Chong et al. | 29/852 |
| 5,716,663 | 2/1998 | Capote et al. | 427/96 |
| 5,778,529 | 7/1998 | Beilin et al. | 29/852 |
| 5,837,356 | * 11/1998 | Katori et al. | 428/210 |
| 5,840,402 | 11/1998 | Roberts et al. | 428/131 |

FOREIGN PATENT DOCUMENTS

0600590A1   8/1994   (EP) .

* cited by examiner

Primary Examiner—Jeffrey Gaffin
Assistant Examiner—Kamand Cuneo
(74) Attorney, Agent, or Firm—Terry J. Anderson; Karl J. Hoch, Jr.

(57) ABSTRACT

A printed wiring board structure having at least one chip-carrying layer adjacent a core fabricated of an organic matrix having disposed therein continuous pitch based graphite fibers. The chip carrying layers and the core have an interface therebetween and are integrally connected to each other through vias plated with an electrically and thermally conductive material to thereby provide a plurality of connection sites along this interface. An organic matrix is preferably fabricated of a polymer material such as an epoxy resin. Preferred fibers are fabricated of pitch based graphite. A typically preferred present printed wiring board structure has several circuit layers and two chip-carrying layers each on opposite sides of the core, with each of the layers and the core having respective interfaces therebetween wherein each layer is integrally connected to the core at a plurality of connection sites, as required by circuit design, along the respective interfaces.

6 Claims, 2 Drawing Sheets

TYPICAL MATERIAL PROPERTIES FOR PITCH BASED
GRAPHITE FIBER / ORGANIC MATRIX COMPOSITE CORES

| MATERIAL [1,2] FIBER GRADE/MATRIX | FIBER VOLUME (%) | THERMAL CONDUCTIVITY (W/m°K) | | MODULUS OF ELASTICITY (Msi) | | COEFFICIENT OF THERMAL EXPANSION (CTE) (ppm/°C) | | DENSITY (lbs.in) |
|---|---|---|---|---|---|---|---|---|
| | | X,Y | Z | X,Y | Z | X,Y | Z | |
| K1100/CYANATE ESTER | 50-65 | 320-400 | 5-20 | 26-35 | 1-5 | 0-3 | 15-50 | .05 |
| K800/CYANATE ESTER | 50-65 | 270-350 | 5-20 | 25-33 | 1-5 | 0-3 | 15-50 | .05 |
| P120/CYANATE ESTER | 50-65 | 150-230 | 3-10 | 25-33 | 1-5 | 0-3 | 15-50 | .05 |
| P100/CYANATE ESTER | 50-65 | 100-180 | 2-8 | 20-25 | 1-5 | 0-3 | 15-50 | .05 |
| P75/CYANATE ESTER | 50-65 | 75-125 | 1-5 | 15-23 | 1-5 | 0-3 | 15-50 | .05 |
| EWC-600 WOVEN FABRIC/EPOXY | 50-60 | 200-300 | 5-20 | 20-25 | 1-5 | 1-5 | 15-50 | .05 |
| K800 WOVEN FABRIC/EPOXY | 50-60 | 240-330 | 5-20 | 20-25 | 1-5 | 1-5 | 15-50 | .05 |

1 TYPICAL CORE THICKNESS: .030" - .060"
2 QUASI-ISOTROPIC LAYUP

Fig. 3

PRINTED WIRING BOARD STRUCTURE HAVING CONTINUOUS GRAPHITE FIBERS

FIELD OF THE INVENTION

This invention relates in general to surface mount and plated through hole technology printed wiring boards, and in particular to a printed wiring board structure interfaced with an integral core fabricated of an organic matrix with pitch based graphite fibers therein disposed, with the board structure and core integrally connected to each other at a plurality of connection sites along the interface thereof.

BACKGROUND OF THE INVENTION

Printed wiring board structures generally are constructed of a core upon which one or more layers carrying ceramic chips or leaded components are laminated. These circuit and chip-carrying layers usually are of metalized (copper clad) polymeric construction such as a polyamide, and can be stacked above and below the core material. In order to provide efficient operation within the wiring board structure, the core should perform favorably with respect to tensile modulus, thermal conductivity, and thermal expansion.

A common core construction now employed is a metal core fabricated as a layer of molybdenum having on each surface thereof a respective layer of copper. While this copper-molybdenum-copper core is satisfactory with respect to tensile modulus, thermal conductivity, and thermal expansion considerations, the weight of this prior-art core can be a significant disadvantage in weight-sensitive applications. Conversely, of course, any replacement core material whose attributes include light weight must still provide satisfactory strength, low coefficient of thermal expansion and heat-response characteristics in order to qualify for wiring board construction.

In view of the above described requirements, it is apparent that a need is present for a printed wiring board structure having a core fabricated to meet weight restraints while providing efficient wiring board performance. Accordingly, a primary object of the present invention is to provide an integrated printed wiring board structure with a core exhibiting high tensile modulus, high thermal conductivity, low coefficient of thermal expansion, and light weight while being compatible with both surface mount and plated through hole technology components and corresponding circuitry.

Another object of the present invention is to provide such a printed wiring board structure whose core construction includes an organic matrix having disposed therein pitch based graphite fibers.

These and other objects of the present invention will become apparent throughout the description thereof which now follows.

SUMMARY OF THE INVENTION

The present invention is a printed wiring board structure comprising at least one chip-carrying layer adjacent a core fabricated of an organic matrix having disposed therein graphite fibers. The chip-carrying layer and the core have an interface therebetween and are integrally connected to each other through vias plated with a thermally and electrically conductive material to thereby provide a plurality of connection sites along this interface. An organic matrix is preferably fabricated of a polymer material such as an epoxy resin or other suitable thermoset material. Preferred fibers are fabricated of pitch based graphite. A typically preferred present printed wiring board structure has two chip-carrying layers each on opposite sides of the core, with each of the layers and the core having respective interfaces therebetween wherein each layer is integrally connected to the core at a plurality of connection sites along the respective interfaces. Additional circuit layers can be affixed to those layers, allowing layer interconnection, and/or interface with the core, thereby increasing circuit density of a wiring board structure. The present printed wiring board structure possesses high tensile modulus, low coefficients of thermal expansion, and light weight to thereby provide versatility in printed wiring board structural utility and placement. Because of the plurality of connection sites along respective interfaces of the core and adjacent circuit and chip-carrying layers, superior thermal conductivity occurs from the layers to the core since heat travels through these connection sites to effectuate extremely efficient heat transfer and ultimate heat dissipation from the entire printed wiring board structure. In this manner reduced operating temperatures are accomplished to thereby yield higher reliability, improved dynamic load, improved thermal fatigue life of solder joints, and accommodation of more circuitry per unit area. In addition, weight savings of 40% to 60% can be realized over current printed wiring board structures.

BRIEF DESCRIPTION OF THE DRAWINGS

An illustrative and presently preferred embodiment of the invention is shown in the accompanying drawings in which:

FIG. 3 is a table showing core material construction components and characteristics.

DETAILED DESCRIPTION OF THE PREFERRED EMBODIMENT

Figure 1:
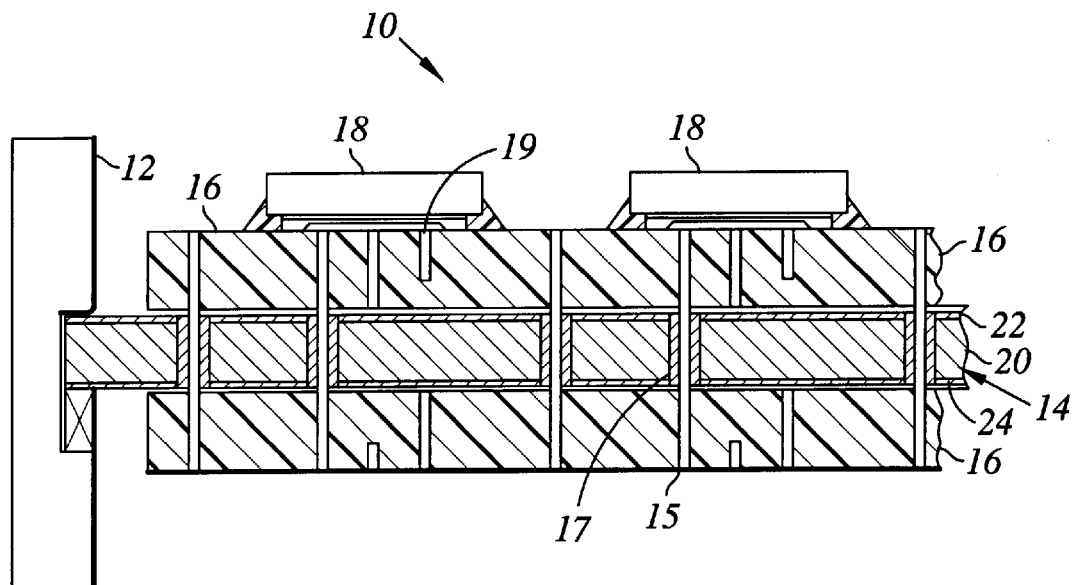
FIG. 1 is a schematic illustration of a cut-away sectional view of a prior art printed wiring board structure with a core fabricated of copper and molybdenum.

Referring first to FIG. 1, a typical prior-art printed wiring board structure 10 is shown. This printed wiring board structure 10 is configured with a conventional card rail 12, and has positioned on either side of a core 14 a plurality of polyamide circuit layers 16 including chip components 18 as known in the art. This prior art core 14 has a molybdenum center layer 20 with respective copper layers 22, 24 disposed above and below the molybdenum center layer 20. As earlier noted, the copper-molybdenum-copper core 14 is generally satisfactory with respect to tensile modulus, thermal conductivity, and thermal expansion considerations, but is of a weight that can be highly disadvantageous depending upon particular applications. Plated through holes 15 are shown with hole fill 17 disposed thereabout through the core 14. Conventional blind vias 19 are shown.

Figure 2:
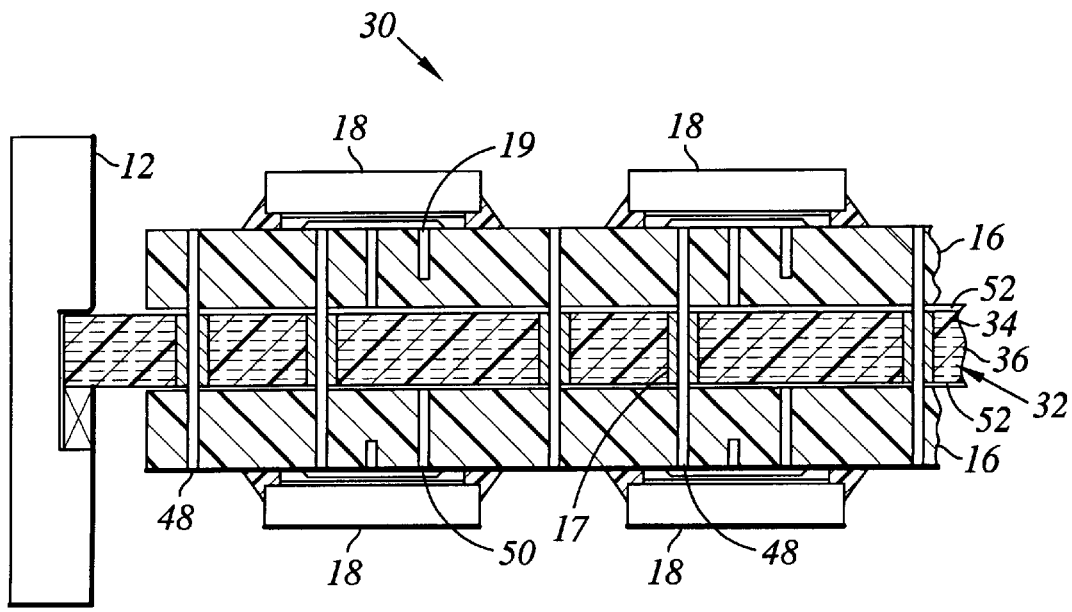
FIG. 2 is a schematic illustration of a cut-away sectional view of a printed wiring board structure with a core fabricated of a polymer matrix having therein disposed pitch based graphite fibers according to the present invention.

FIG. 2 illustrates the preferred embodiment of the present invention. In particular, and similar to the illustration of FIG. 1, FIG. 2 shows a printed wiring board structure 30 configured with a conventional card rail 12, a novel core 32, and polyamide circuit layers 16 including chip components 18. The core 32 is fabricated of an epoxy resin matrix 34 having disposed therein continuous pitch-based graphite fibers 36 substantially unidirectionally oriented and generally uniformly disposed throughout the matrix 34. A core 32 of this construction has a coefficient of thermal expansion (CTE) between about 0 and 5 ppm/° C. and supports the low CTE required for surface mount technology solder joint reliability. The respective chip-carrying layers 16 and core 32 of the embodiments of FIG. 2 have interfaces 52 therebetween and are electrically connected to each other (as required) through vias 48 extending between the layers 16 and core 32 which are plated with thermally conductive material 50 to thereby provide a plurality of connection sites along this interface to accommodate heat transfer to the core 32 for dissipation therefrom as described above and in addition to thermal vias 50.

Operationally, the preferred embodiment 30 has favorable characteristics with respect to high tensile modulus, high thermal conductivities, low coefficients of thermal expansion, and light weights. The pitch-based graphite fiber segments 36 of the core 32 especially provide extremely high tensile modulus, high thermal conductivity, low density, and selectable coefficient of thermal expansion of the core 32 obtainable by varying the fiber volume, fiber grade and fiber orientation during core manufacture. The table shown in FIG. 3 non-limitedly exemplifies construction variability and selectability with the fiber grade designations identifying fiber products from Amoco Corporation, Chicago, Ill. Because of the plurality and conductivity of connections along the respective interfaces 52, the present invention provides novel temperature control and circuit density since every connection results in heat transfer to the core 32.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A printed wiring board structure comprising at least one chip-carrying layer adjacent a core fabricated of an organic matrix having disposed therein continuous pitch based graphite fibers, with said layer and said core having an interface therebetween and wherein the layer is integrally connected along said interface at a plurality of connection sites to the core at a plurality of vias each plated with a thermally and electrically conductive material and extending between the layer and the core.

2. A printed wiring board structure as claimed in claim 1 wherein the organic matrix of the core is a polymer material.

3. A printed wiring board structure as claimed in claim 2 wherein the organic matrix of the core is a thermoset material.

4. A printed wiring board structure as claimed in claim 3 wherein the organic matrix of the core is an epoxy resin.

5. A printed wiring board structure as claimed in claim 1 comprising two chip-carrying layers each on opposite sides of the core and each adjacent thereto, with each of said layers and said core having respective interfaces therebetween and wherein each layer is integrally connected along each said respective interface at a plurality of connection sites to the core at a plurality of vias each plated with a thermally conductive material and extending between each said respective layer and the core.

6. A printed wiring board structure as claimed in claim 1 wherein at least one additional chip-carrying layer is layerly affixed to the at least one chip carrying layer connected to the core.

* * * * *

UNITED STATES PATENT AND TRADEMARK OFFICE
CERTIFICATE OF CORRECTION

PATENT NO. : 6,207,904 B1
DATED : March 27, 2001
INVENTOR(S) : Jesse J. Kramer, Jeffrey R. Madura and Carl Richard Smith It is certified that error appears in the above-identified patent and that said Letters Patent is hereby corrected as shown below:

<u>Title page,</u>  STATEMENT OF GOVERNMENT RIGHTS

This invention was made with Government Support under contract F33657-92-C-0008 awarded by the United States Air Force. The Government has certain rights in this invention.

Signed and Sealed this

Nineteenth Day of March, 2002

Attest:

JAMES E. ROGAN
*Attesting Officer*  *Director of the United States Patent and Trademark Office*